(12) United States Patent
Hergenrother et al.

(10) Patent No.: US 6,828,628 B2
(45) Date of Patent: Dec. 7, 2004

(54) DIFFUSED MOS DEVICES WITH STRAINED SILICON PORTIONS AND METHODS FOR FORMING SAME

(75) Inventors: John Michael Hergenrother, Short Hills, NJ (US); Muhammed Ayman Shibib, Wyomissing, PA (US); Shuming Xu, Schnecksville, PA (US); Zhijian Xie, Allentown, PA (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 10/382,142

(22) Filed: Mar. 5, 2003

(65) Prior Publication Data

US 2004/0173846 A1 Sep. 9, 2004

(51) Int. Cl.$^7$ .............................................. H01L 29/72
(52) U.S. Cl. ..................... 257/335; 257/19; 257/192; 257/194; 257/285; 257/616
(58) Field of Search ........................ 257/335, 19, 192, 257/194, 285, 616

(56) References Cited

U.S. PATENT DOCUMENTS

| | | | |
|---|---|---|---|
| 5,776,812 A | 7/1998 | Takahashi et al. | 438/268 |
| 5,780,324 A | 7/1998 | Tokura et al. | 438/138 |
| 6,107,661 A | 8/2000 | Okabe et al. | 257/330 |
| 2002/0030227 A1 * | 3/2002 | Bulsara et al. | 257/346 |
| 2002/0125471 A1 * | 9/2002 | Fitzgerald et al. | 257/19 |

OTHER PUBLICATIONS

"Amberwave and Aixtron to Develop CVD Equipment for SiGe and Strained Si," http://www.compoundsemiconductor.net/articles/news (May 17, 2002).

Huang et al., "Carrier Mobility Enhancement in Strained Si–On–Insulator Fabricated by Wafer Bonding," Symp. on VLSI Technology, 59 (2001).

Lammers, D., "AmberWave Strained-Silicon Process Removes Troublesome SiGe Layer," Electronic Engineering Times (Oct. 21, 2002).

Murphy, T., "Intel Strains to Pull Ahead—Process Technology Disclosure Raises Eyebrows" Electronic News, p. 14 (Aug. 19, 2002).

Rim et al., "Strained Silicon NMOSFETs for High Performance CMOS Technology," Symp. on VLSI Technology, 59 (2001).

* cited by examiner

Primary Examiner—Edward Wojciechowicz (57) ABSTRACT

A diffused MOS device comprises one or more strained silicon portions formed in a carrier transit path of the DMOS device. The one or more strained silicon portions may comprise a layer of strained silicon, generally formed above a layer of lattice mismatch material such as silicon germanium or silicon carbide. The carrier transit path is at least partially defined by a body of the DMOS device, and may also include other regions, such as a diffusion area, channel region, or accumulation region. The one or more strained silicon portions may be formed only in selected regions of the DMOS device or may be formed as a layer throughout. The one or more strained silicon portions may be formed through patterning of a hard mask, forming a lattice mismatch layer, forming a strained silicon layer, and removing the hard mask. Trenches may also be formed prior to forming the lattice mismatch material on the patterned hard mask.

20 Claims, 7 Drawing Sheets

DIFFUSED MOS DEVICES WITH STRAINED SILICON PORTIONS AND METHODS FOR FORMING SAME

FIELD OF THE INVENTION

The present invention relates generally to semiconductor devices, and more particularly to diffused metal oxide semiconductor (MOS) devices.

BACKGROUND OF THE INVENTION

One type of diffused metal oxide semiconductor (MOS) device is a double-diffused MOS (DMOS) device, which has gained popularity in certain applications for high power capabilities. There are various types of DMOS devices, such as Lateral DMOS (LDMOS) devices, vertical DMOS devices, and trench DMOS devices. In an LDMOS device, the gate is placed adjacent the source region, which is a highly doped region created via a diffusion and which normally is connected to a conductor to form the source of the LDMOS device. The drain, which also comprises a highly doped drain region and a conductor connected thereto, is placed some distance away from the gate. The gate is formed on a surface of a semiconductor region, while the source and drain regions are formed under the surface of the semiconductor region. Between the gate and the drain region are one or more lightly doped diffusion areas, generally called a lightly doped drain ($L_{DD}$). Because an LDMOS device has drain regions at the top surface of a semiconductor region, the LDMOS device tends to occupy a larger surface area as compared to other DMOS devices.

Vertical and trench DMOS devices, for example, tend to occupy a smaller surface area than LDMOS devices because their drain regions are vertically situated. In both vertical and trench DMOS devices, the source region or regions and gate are formed near a top surface of a semiconductor region and the drain region is formed on a lower surface of a semiconductor region or formed as a buried layer. Because the source and drain regions are vertical with respect to the top surface of the semiconductor region, a higher density, as compared to LDMOS, may be achieved. However, this density can come at the cost of increased manufacturing complexity. By way of example, a trench DMOS device has a trench in which the gate is formed. The gate is surrounded by a relatively thin layer of insulator on at least three sides of the gate. Formation of the gate and insulator in the trench requires multiple processing steps.

One distinguishing feature of a DMOS device, as compared to, for example, a complementary MOS (CMOS) device, is a body that is diffused from the source side only and that underlies the gate of the DMOS device. The body also underlies the source region, and the body is a different conductivity type than the conductivity type of the source and drain regions. Two diffusions are generally used to form the body and one or both of the source and drain regions: one diffusion is used to form the body and another diffusion forms one or both of the source and drain regions. Thus, the term "double-diffused" is used to describe these MOS devices. Another feature of DMOS devices is a drift region. The drift region is characterized, in a forward conduction mode of the DMOS device, by carriers "drifting" under the influence of an electric field. The drift region is generally formed from a single, lightly doped region between the drain region and the gate. However, there are certain devices that use multiple layers to form a drift region. An example is called a "superjunction" structure. The drift region allows a voltage drop to occur so that a DMOS device can sustain a higher voltage than other semiconductor devices, such as CMOS devices.

Although DMOS devices provide substantial voltage handling and other benefits, as compared to CMOS devices, there is still a need to further improve conventional DMOS devices.

SUMMARY OF THE INVENTION

The present invention provides diffused metal oxide semiconductor (MOS) devices having strained silicon portions and techniques for forming the same.

In accordance with one aspect of the invention, a diffused MOS device is formed comprising source and drain regions, both of a first conductivity type and formed in a semiconductor region. The DMOS device also comprises a gate proximate the source region. The DMOS device further comprises a body of a second conductivity type and formed in the semiconductor region. The body at least partially overlaps the source region and at least partially overlaps the gate, and the body forms at least a portion of a carrier transit path between the source region and the drain region. Additionally, one or more strained silicon portions are formed at least in part in the carrier transit path.

The one or more strained silicon portions may comprise a layer of strained silicon, generally formed above a layer of lattice mismatch material such as silicon germanium or silicon carbide. The carrier transit path may include other regions, such as a diffusion area, channel region, or accumulation region. Additionally, the one or more strained silicon portions may be formed only in selected regions of the DMOS device or may be formed throughout a large portion of the DMOS device.

In accordance with a further aspect of the invention, the one or more strained silicon portions may be formed through the patterning of a hard mask, forming a lattice mismatch layer on the patterned hard mask, forming a strained silicon layer on the lattice mismatch layer, and removing the hard mask. Trenches may also be formed prior to forming the lattice mismatch material on the patterned hard mask.

In another aspect of the invention, multiple different types of DMOS devices may be created, such as lateral DMOS devices, vertical DMOS devices, and trench DMOS devices.

In accordance with a further aspect of the invention, DMOS devices having strained silicon portions may also be integrated with other devices, such as complementary MOS (CMOS) devices or bipolar junction transistor devices.

DETAILED DESCRIPTION

Techniques are presented herein for creating DMOS devices with strained silicon portions. The strained silicon portions are generally formed in at least the drift region of a DMOS device. Techniques for forming conventional DMOS devices are well known in the art. Consequently, emphasis is placed herein on exemplary techniques for forming strained silicon portions in DMOS devices and DMOS devices containing the strained silicon portions.

The DMOS devices described herein are devices using electrons as carriers. However, the benefits described above are also applicable to devices using holes as carriers.

Figure 1:
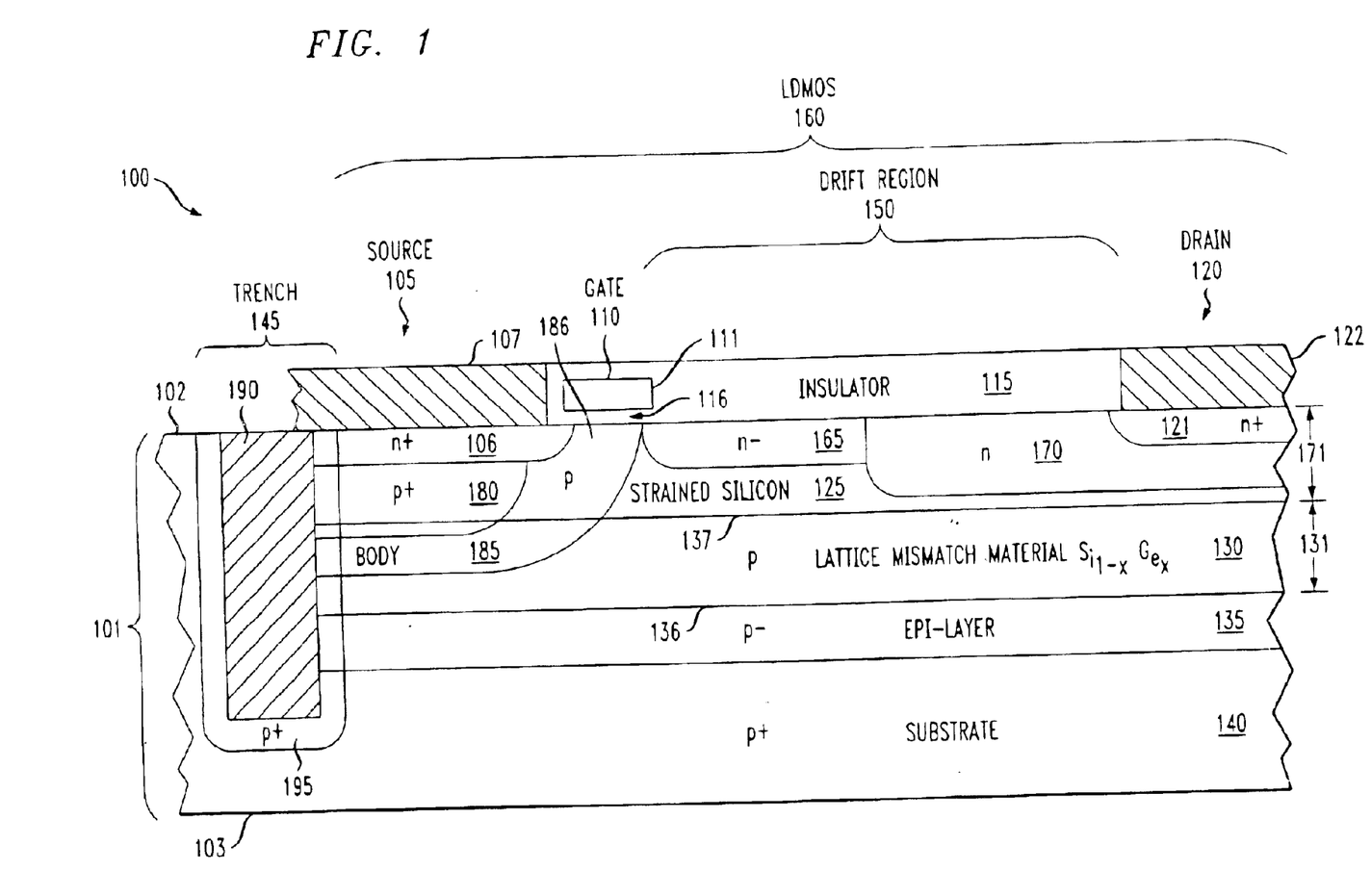
FIG. 1 is an example of a portion of a semiconductor containing a lateral DMOS device having a strained silicon layer, in accordance with a preferred embodiment of the invention.

Turning now to FIG. 1, a portion 100 of a semiconductor is shown. Semiconductor portion 100 comprises a separating trench 145, a substrate 140, an epitaxial ("epi") layer 135, a lattice mismatch material layer 130, a strained silicon layer 125, a body 185, an enhancement region 180, a source region 106, two diffusion areas 165 and 170, a drain region 121, an insulator 115, a gate 110, a source conductor 107 and a drain conductor 122. Trench 145 comprises an insulator or polysilicon layer 190 and a shorting layer 195. Formed in semiconductor portion 100 is a lateral DMOS (LDMOS) device 160, which comprises a source 105, the gate 110 and its insulator 115, a drift region 150, the drain 120, and the body 185. Substrate 140, epitaxial layer 135, lattice mismatch material 130, and strained silicon layer 125 will be called a semiconductor region 101 herein. The semiconductor region 101 has a top surface 102 and a bottom surface 103, both of which are generally planarized through techniques such as chemical-mechanical polishing (CMP).

In this example, the gate 110 slightly overlaps the source region 106 but is spaced some distance apart from, and does not overlap, the drain region 121. The term "overlap" is not meant to imply that a feature has to be "over" a region. Instead, the term "overlap" means that a vertical or horizontal line or plane (relative to top surface 102 or bottom surface 103) would, if passed through at least a portion of the feature (e.g., a gate) and at least a portion of a region (e.g., the drain region), intersect. For instance, FIG. 4, described below, illustrates a trench DMOS device where the gate overlaps a source region but the gate is situated vertically in the semiconductor region (e.g., semiconductor region 101).

Source 105 comprises the source conductor 107 and source region 106, which is a highly doped region. Drain 120 comprises the drain conductor 122 and drain region 121, which is a highly doped region. Insulator 115 has a thin portion 116 underlying the gate 110. Drift region 150 is a region between gate edge 111 and drain region 121, and drift region 150 comprises a lightly doped diffusion area 165 and a moderately doped diffusion area 170.

As described above, the drift region 150 is characterized, in a forward conduction mode of LDMOS device 160, by carriers drifting under the influence of an electric field. In this example, the drift region 150 is formed via the two diffusion areas 165 and 170. Although not shown in FIG. 1, there are certain devices that use multiple layers to form a drift region. For instance, some devices use a drift region formed by using a superjunction, as described in T. Fujihara et al., "Simulated Superior Performance of Semiconductor Superjunction Devices," Proc. of the 10th Int'l Symp. on Power Semiconductor Devices & ICs, 423 (1998), the disclosure of which is hereby incorporated by reference.

Substrate 140 is, in this example, a highly doped substrate. Epitaxial layer 135 is a lightly doped layer that is formed on substrate 140, generally by growing the epitaxial layer 135. Lattice mismatch material layer 130 is, in this example, silicon germanium, $Si_{1-x}Ge_x$, where "x" is chosen in order to create certain spacing for the lattice structure in the strained silicon layer 125. Lattice mismatch material layer 130 is generally deposited on epitaxial layer 135 through techniques such as ultrahigh vacuum chemical-vapor deposition (CVD) and molecular beam epitaxy (MBE). Similarly, strained silicon layer 125 is also generally formed via CVD. A typical strained silicon layer has about eighty percent higher carrier mobility and about ten percent higher saturation velocity for carriers than a conventional silicon layer. Techniques for forming a silicon germanium layer 130 and a strained silicon layer 125 are known to those skilled in the art. For instance, AmberWave Systems, located at 13 Garabedian Drive, Salem, N.H., 03079, has developed suitable techniques for forming these layers. A reference that discusses strained silicon layers in terms of CMOS is K. Rim et al., "Strained Silicon NMOSFETs for High Performance CMOS Technology," Symp. on VLSI Technology, 59 (2001), the disclosure of which is hereby incorporated by reference.

As described above, body 185 is a distinguishing feature of DMOS devices, as compared to MOS devices. Body 185 is a medium doped region that at least partially underlies gate 110 and, therefore, at least partially fills channel 186. Body 185 is generally doped one to two orders of magnitude higher than the epitaxial layer 135. A DMOS device, such as LDMOS 160, generally uses two diffusions in order to form, with one diffusion, body 185 and, with a second diffusion, source region 106 and drain region 121. Enhancement region 180 is optional but is beneficial to reduce the occurrence of latch up due to a parasitic bipolar junction formed by source region 106, body 185, and diffusion areas 165, 170. The shorting layer 195 is beneficial in order to (1) connect the top source region 106 to the heavily doped substrate 140 and (2) to short the parasitic bipolar junction formed by source region 106, body 185, and diffusion areas 165, 170.

Diffusion areas 165 and 170 are part of drift region 150. In the drift region 150, current from channel 186 passes through the diffusion areas 165 and 170 and to drain region 121. Consequently, the increased mobility and saturation velocity, as compared with a conventional silicon layer, of the strained silicon layer 125 provide maximal benefit when used in drift region 150.

The strained silicon layer 125 has a thickness 171. Similarly, the lattice mismatch material layer 130 has a thickness 131. Generally, the thickness 171 of the strained silicon layer 125 is varied depending on application. For example, a higher power LDMOS 160 might have a thicker strained silicon layer 125, in order to totally encompass the diffusion areas 165, 170. Additionally, the lattice mismatch material layer 130 has a thickness 131. This thickness 131 is generally a predetermined thickness in order to create an appropriate lattice structure at boundary 137 of the strained silicon layer 125, where the appropriate lattice structure is defined by the ratio between silicon and germanium in the $Si_{1-x}Ge_x$ lattice mismatch material layer 130 at the boundary 137. The thickness 131 generally runs from a few hundred angstroms to about two thousand angstroms. In some $Si_{1-x}Ge_x$ deposition techniques, the ratio between silicon and germanium, as defined by the variable "x," is varied as the lattice mismatch material layer 130 is grown from boundary 136 to boundary 137 of epitaxial layer 135. For instance, AmberWave Systems has disclosed grading techniques in order to produce such a variance in ratio. Additionally, the thickness 131 of the lattice mismatch material 130 is usually greater than the thickness 171 of the strained silicon layer 125.

It should be noted that diffusion areas 165, 170 can be diffused into the lattice mismatch material 130, but this is less preferable than having the diffusion areas 165, 170 be relegated above boundary 137.

In the example of FIG. 1, a carrier transit path between the source region 106 and drain region 121 is as follows: carriers are emitted from the source region 106, travel through a channel defined in the body 185, travel through the drift region 150, and to the drain region 121. The carrier transit path can include the source region 106 and drain region 121.

Figure 2:
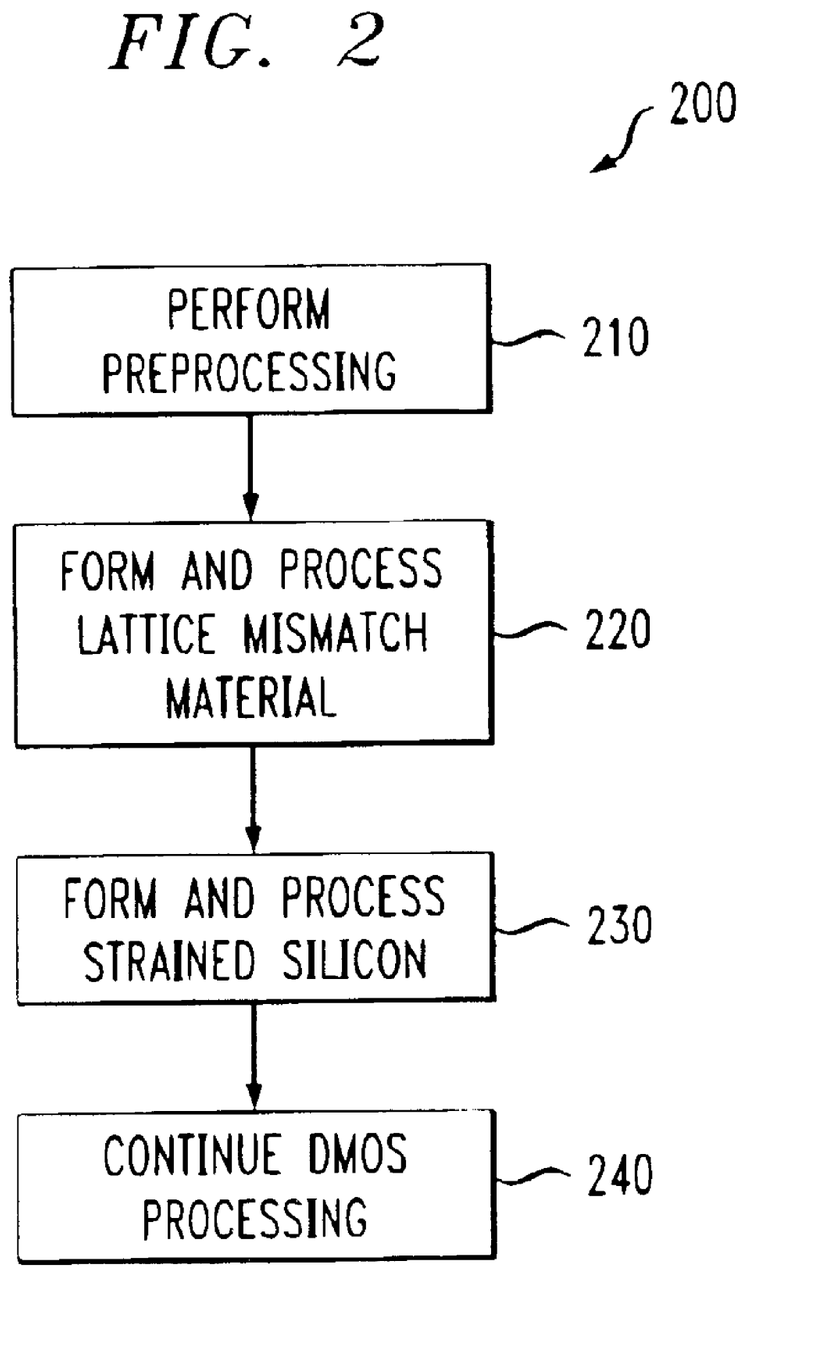
FIG. 2 is a flowchart of an exemplary method for forming a DMOS device having a strained silicon portion in accordance with a preferred embodiment of the invention.

Turning now to FIG. 2, an exemplary method 200 is shown for forming an LDMOS 160 having a strained silicon portion, which, in this example, is a strained silicon layer 125. Method 200 is performed during LDMOS processing, which is well known in the art.

In step 210, preprocessing is performed. Such preprocessing can include doping of substrate 140, if not already doped, formation of the epitaxial layer 135, and chemical-mechanical polishing (CMP), if needed, of the epitaxial layer 135 in order to form a smooth boundary 136.

In step 220, the lattice mismatch material layer 130 is formed through processes known to those skilled in the art. Illustratively, a silicon germanium layer may be formed by ultrahigh vacuum CVD and MBE. In step 220, the lattice mismatch material layer 130 may also be processed, such as through CMP, in order to prepare the boundary 137 for formation of strained silicon layer 125. AmberWave Systems has developed suitable CMP techniques for a lattice mismatch material layer 130 layer of silicon germanium.

In step 230, the strained silicon layer 125 is formed and, if desired, processed. Strained silicon layer 125 may be formed, as is known in the art, through a variety of techniques such as CVD and MBE. The strained silicon layer 125 may also be processed, if desired, through such techniques as CMP.

In step 240, LDMOS processing is continued in order, for example, to define body 185, enhancement region 180, source 105, drain 120, diffusion areas 165 and 170, gate 110, insulator 115, and trench 145.

Thus, method 200 allows an LDMOS device 160 to be created having a strained silicon layer 125. Although silicon germanium is and will be described herein as the lattice mismatch material layer 130, other lattice mismatch materials may be used, such as silicon carbide. Additionally, it is also possible that the strained silicon layer 125 would be placed onto the epitaxial layer 135, without the intervening lattice mismatch material layer 130. For instance, epitaxial deposition of silicon could be continued over a silicon-germanium layer until the strained silicon layer is thick enough to remove.

It should also be noted that DMOS devices having strained silicon portions may be integrated with other devices, such as CMOS devices or bipolar junction transistor devices. Such integration generally occurs as part of an integrated circuit. The processing to create the CMOS or bipolar devices may occur before, during, or after the steps of method 200.

Figure 3:
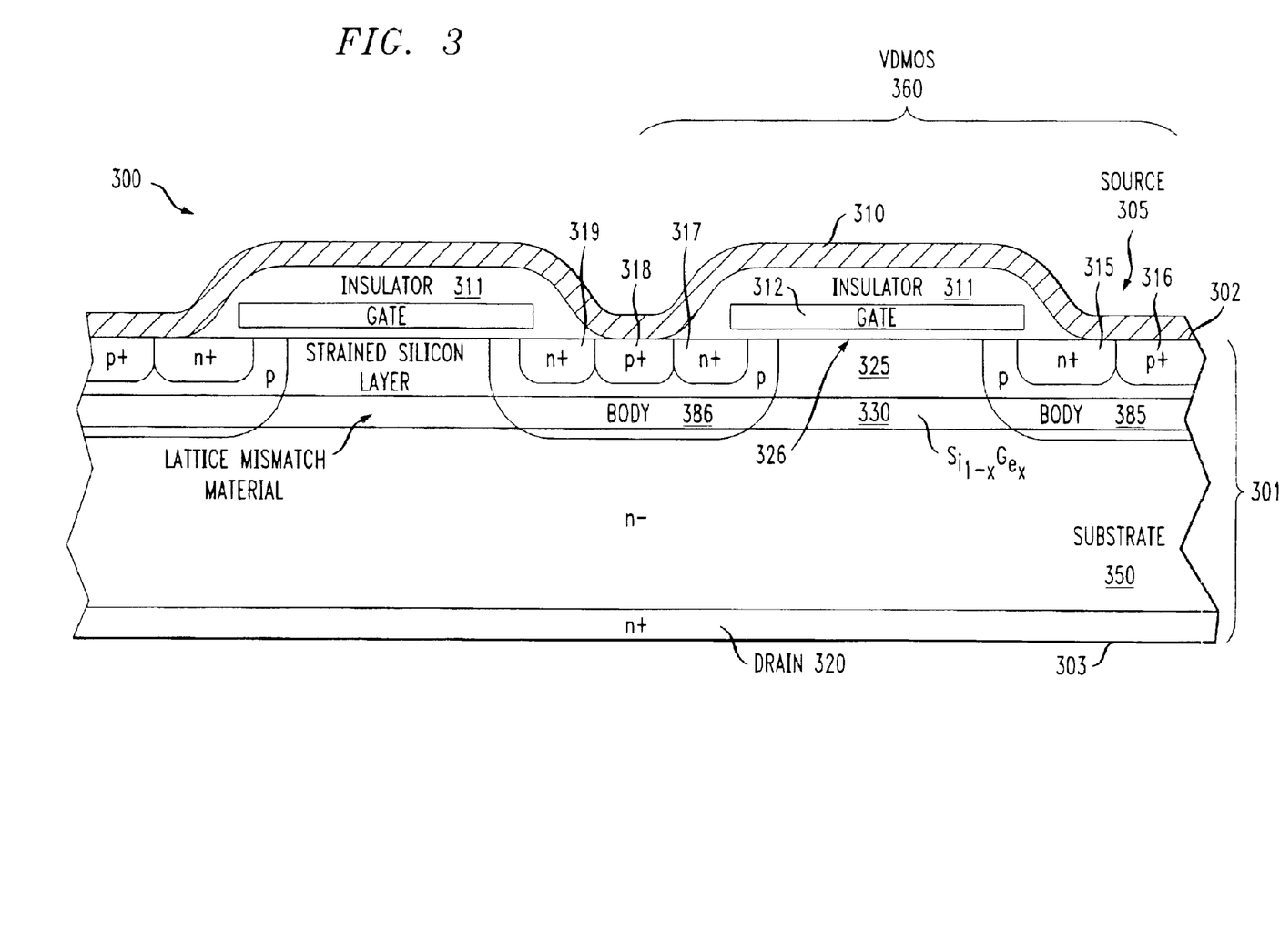
FIG. 3 is an example of a portion of a semiconductor comprising a vertical DMOS device having a strained silicon portion, in accordance with a preferred embodiment of the invention.

Referring now to FIG. 3, a semiconductor portion 300 is shown having a number of vertical DMOS (VDMOS) devices, of which VDMOS device 360 is referenced. In this example, VDMOS device 360 comprises a source 305 coupled to a drain region 320 through a substrate 350, bodies 385 and 386, an accumulation layer 326, source regions 315 and 317, and conductor 310. The accumulation layer 326 is formed by gate 312, which is formed over insulator 311. Insulator 311 also surrounds gate 312 in this example. Conductor 310 is formed over insulator 311. The regions 316 and 318 are used to reduce latch up. The drain region 320, substrate 350, lattice mismatch material layer 330, and strained silicon layer 325 will be referred to as semiconductor region 301 herein, which has a top surface 302 and a bottom surface 303. It should be noted that an additional substrate layer (not shown) may also exist below bottom surface 303, in certain embodiments.

When gate 312 has a voltage beyond a threshold voltage and conductor 310 has a suitable voltage, a carrier transit path is as follows: carriers pass from the highly doped source region 315, through a surface (e.g., near insulator 311) of body 385 and body 385, through channel lattice mismatch material 330, through substrate 350, and to drain region 320. A similar carrier transit path can occur from source region 317 to drain region 320. Drain region 320 could be a highly doped region formed, for instance, on a backside of a semiconductor wafer. Alternatively, the drain region 320 can be formed as a buried layer in substrate 350. Generally, a drain would be formed by contacting the drain region 320 with a conductive lead of some type.

In this example, a drift region lies between insulator 311 and drain region 320 (e.g., the area comprising the strained silicon layer 325, the lattice mismatch material layer 330, and the substrate 350 between the bodies 385, 386). Illustratively, the strained silicon layer 325 is, as in the VDMOS 160 of FIG. 1, formed over a lattice mismatch material layer 330.

The gate 312 overlaps source region 315 and is spaced some distance from the drain region 320. Body 385 partially overlaps gate 312.

Method 200 of FIG. 2 can be used to form the VDMOS device 360. For instance, the substrate 350 may be prepared through known techniques (see step 210 of FIG. 2), the lattice mismatch material layer 330 can be formed and processed through techniques as disclosed in step 220 of FIG. 2, and the strained silicon layer 325 can be formed and processed as disclosed in step 230 of FIG. 2. The semiconductor portion 300 can be completed, as described in step 240 of FIG. 2, through techniques known to those skilled in the art. For example, the gate 312 and underlying insulator 311 can be formed, then the bodies 385, 386 can be formed, the region 318 formed, and the insulator 311 and conductor 310 formed.

Figure 4:
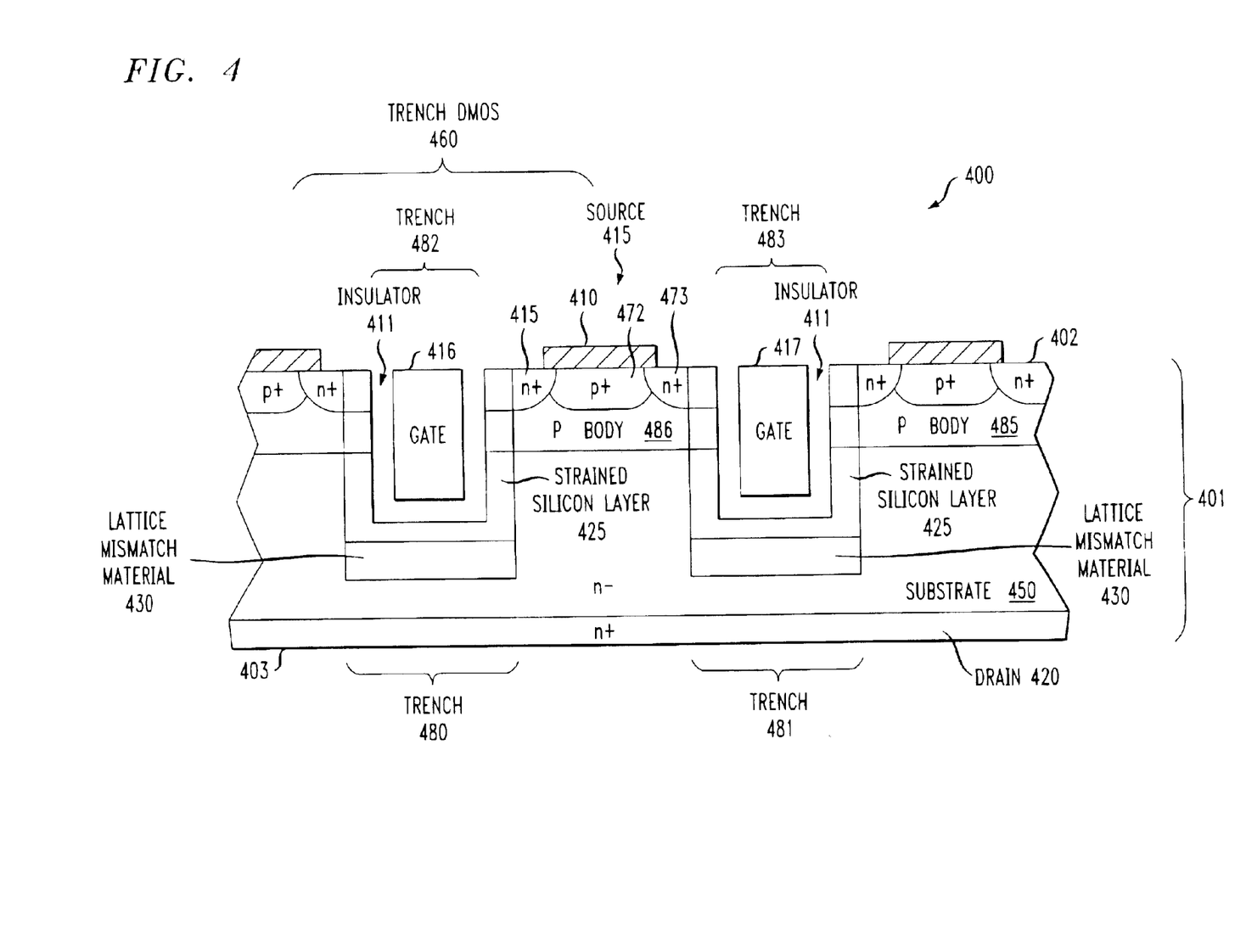
FIG. 4 is an example of a portion of a semiconductor comprising a trench DMOS device having a strained silicon layer, in accordance with a preferred embodiment of the invention.

Turning now to FIG. 4, a portion 400 of a semiconductor having trench DMOS devices is shown, of which trench DMOS device 460 is referenced. Trench DMOS device 460 comprises a source 415, a gate 416, insulator 411, body 486, substrate 450, and drain 420. Source 415 comprises conductor 410 and source region 415. In Trench DMOS 460, when an appropriate voltage is applied to gate 416 and a suitable voltage is applied to conductor 410 of source 415, a carrier transit path is as follows: carriers flow through highly doped source region 415, through body 486, through substrate 410, and to drain 420. Highly doped region 472 is used to reduce latch up. Highly doped region 473 can also be used as part of a source 415 when gate 417 is used. As described above in reference to drain region 320, the drain region 420 can be a highly doped region formed on the backside of a semiconductor wafer or could be a buried layer. Additionally, the drain region 420 would generally be coupled to a conductor (not shown) in order to form a drain (not shown). The drain region 420, substrate 450, body 485, and other diffusion regions (e.g., source region 415) will be referred to as semiconductor region 401 herein, which has a top surface 402 and a bottom surface 403. It should be noted that an additional substrate layer (not shown) may also exist below bottom surface 403, in certain embodiments.

In FIG. 4, the gate 426 overlaps the source region 415 and is spaced some distance from the drain region 420. Additionally, the body 486 overlaps the gate 416.

Figure 5:
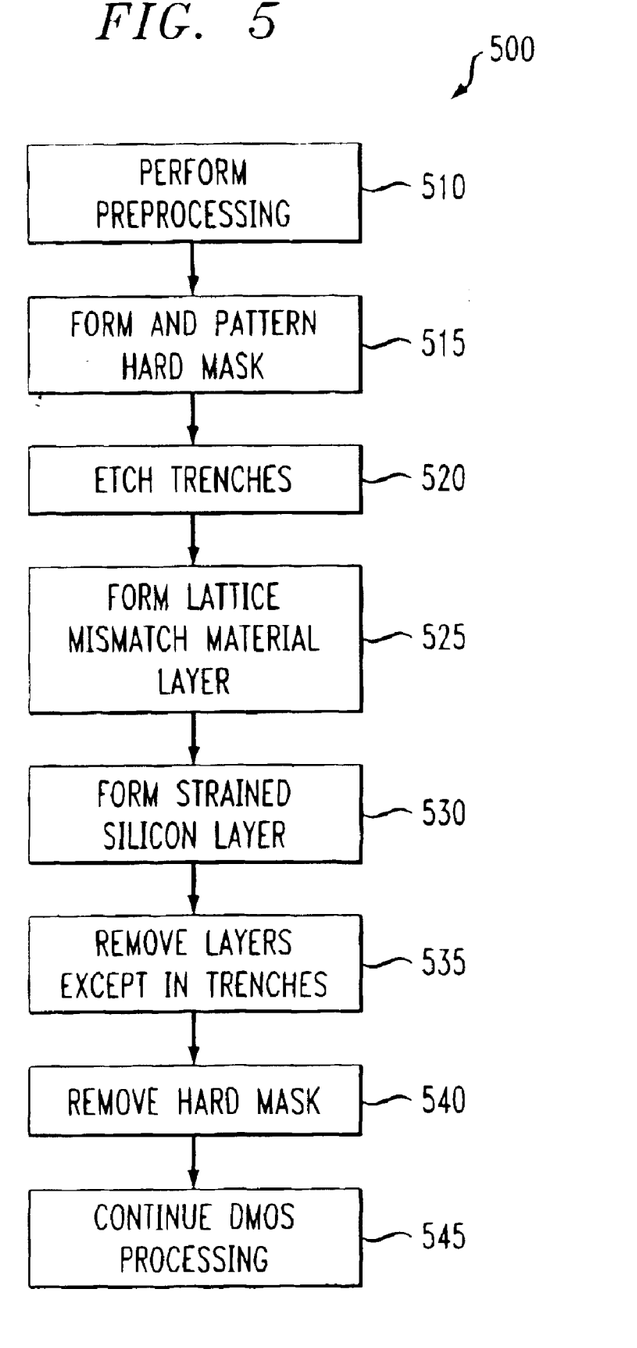
FIG. 5 is a flowchart of an exemplary method for forming trench DMOS devices, in accordance with a preferred embodiment of the invention.

In the example of FIG. 4, the drift region comprises the area beneath the body 486 and to the drain 420. The strained silicon layer 425 is formed over lattice mismatch material 430, and both are formed in this example in trenches 480, 481. Referring now to FIG. 5 with appropriate reference to FIG. 4, an exemplary method 500 is shown for forming the trench DMOS devices shown in FIG. S. Method 500 begins in step 510 when preprocessing is performed. The step of preprocessing could be a simple as using a cleaning solution in order to prepare the semiconductor portion 400 for subsequent steps. Additionally, the bodies 485, 486 could be doped. In step 515, a hard mask is formed on the semiconductor portion 400 and is patterned in order to define trenches 480, 481. The hard mask is formed through known techniques and could comprise oxide or oxide-nitride, for instance. In step 520, trenches, such as trenches 480, 481, are etched through known techniques such as Reactive Ion Etching (RIE). In step 525, a lattice mismatch material layer (e.g., lattice mismatch material layer 430), such as silicon germanium, is formed. As described above, it is possible to grade the lattice mismatch material. In step 530, a strained silicon layer is formed. The lattice mismatch material layer and strained silicon layer are formed through techniques such as those previously described.

In step 535, the lattice mismatch material layer and strained silicon layer are removed except in the trenches. This could occur by using an etch specific to silicon germanium, which would preferentially remove silicon germanium, yet such an etch should leave the trenches 480, 481 intact. In step 540, the hard mask is removed through, for instance, reactive ion etching (RIE) or wet etching. It should be noted that both steps 535 and 540 may be performed through RIE or wet etching.

In step 545, DMOS processing is continued in order to define trenches 482, 483, add insulator 411, define trenches for gates 416, 417, perform doping of regions 415, 473, and 472, and define conductors 410. These steps are known to those skilled in the art.

Figure 6:
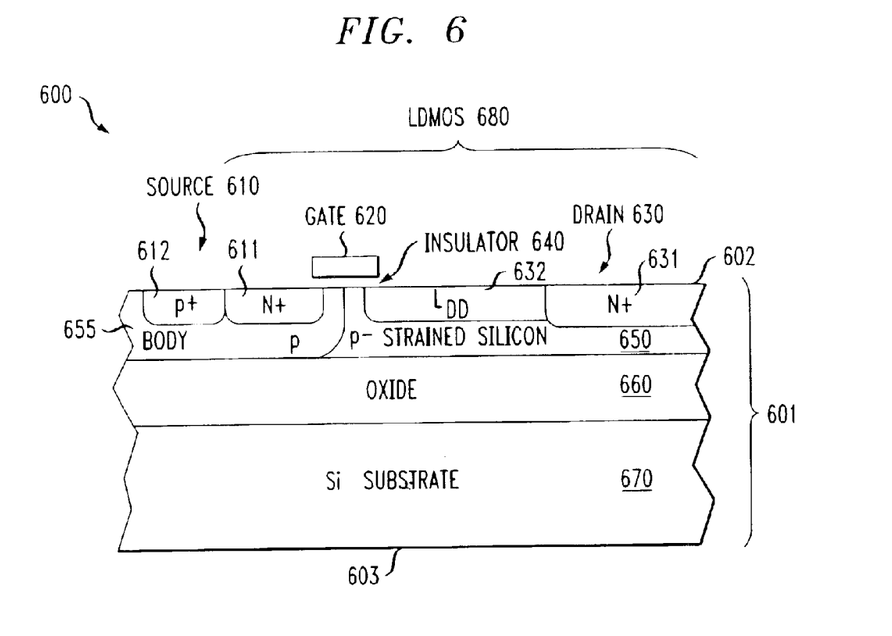
FIG. 6 is an example of a portion of a semiconductor comprising an LDMOS device on silicon on insulator (SOI), having a strained silicon layer, in accordance with a preferred embodiment of the invention.

Turning now to FIG. 6, an LDMOS device 680 on silicon-on-insulator (SOI) is shown on semiconductor portion 600. Semiconductor portion 600 comprises the LDMOS device 680, a highly doped region 612, an oxide layer 660, and a silicon substrate 670. LDMOS device 680 comprises a source 610, a gate 620 formed over an insulator 640, a body 655, and a drain 630. Source 610 comprises a highly doped region 611 and will generally comprise a conductor (not shown) coupled to the highly doped region 611. The drain 630 comprises a lightly doped drain (LDD) 632 and a highly doped region 631, and will generally comprise a conductor (not shown) coupled to the region 631. The substrate 670, oxide layer 660 and strained silicon layer 650 will be referred to as semiconductor region 601 herein, which also has a top surface 602 and a bottom surface 603.

The strained silicon layer 650 exists above and coupled to the oxide 660. AmberWave Systems has a process to separate a strained silicon layer from an underlying silicon germanium layer and to bond the separated strained silicon layer to an oxide layer.

Figure 7:
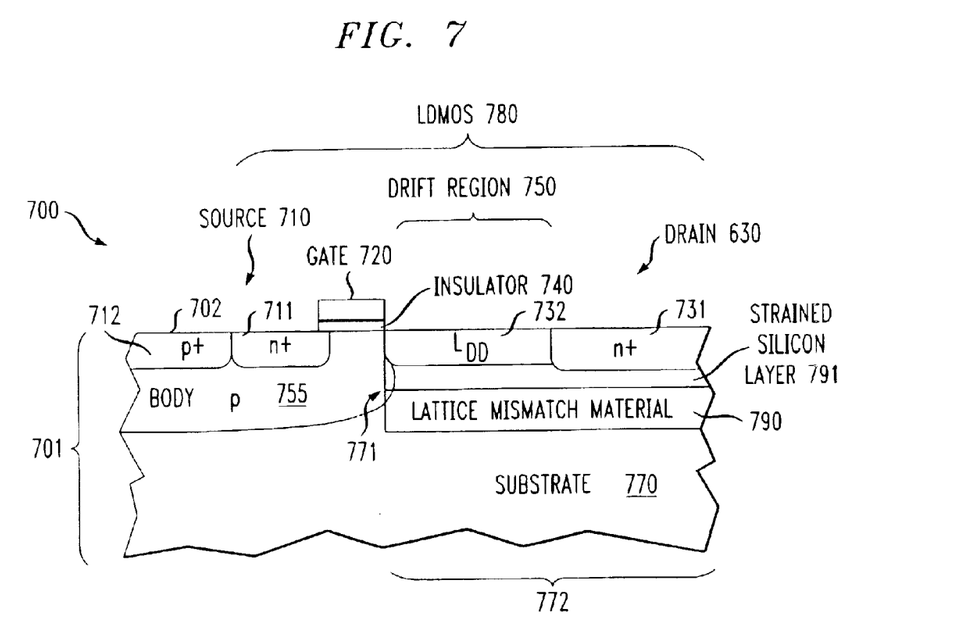
FIGS. 7 and 8 are examples of portions of a semiconductor comprising an LDMOS device having strained silicon portions, in accordance with a preferred embodiment of the invention.

Turning now to FIG. 7, an LDMOS device 780 is shown formed on a semiconductor portion 700. The semiconductor portion 700 comprises the LDMOS device 780, a highly doped region 712, and substrate 770. LDMOS device 780 comprises a source 710, a gate 720 formed over an insulator 740, a body 755, and a drain 730. Source 710 comprises a highly doped source region 711 and will generally comprise a conductor (not shown) coupled to the highly doped source region 711. The drain 730 comprises an LDD 732 and a highly doped region 731, and will generally comprise a conductor (not shown) coupled to the region 731. The substrate 770, body 755, lattice mismatch material 790, strained silicon layer 791, and diffusion areas (e.g., source region 711 and highly doped region 712) will be referred to as a semiconductor region 701, which has a top surface 702.

In this example, a strained silicon region 791 is formed over the lattice mismatch material region 790. The strained silicon region 791 fills the drift region 750. The strained silicon region 791 may be formed by the following technique. A hard mask (not shown) can be formed over substrate 770 and patterned so that the area 772 (to the right of edge 771) is uncovered. The area 772 is etched using conventional techniques. A lattice mismatch material layer is formed, as is a strained silicon layer. The strained silicon layer and lattice mismatch material layer are removed from the semiconductor portion 700 except in area 772 by selective etching. Then, the hard mask is removed through conventional techniques. Alternatively, the lattice mismatch material, strained silicon layer and hard mask can be removed via CMP.

Figure 8:
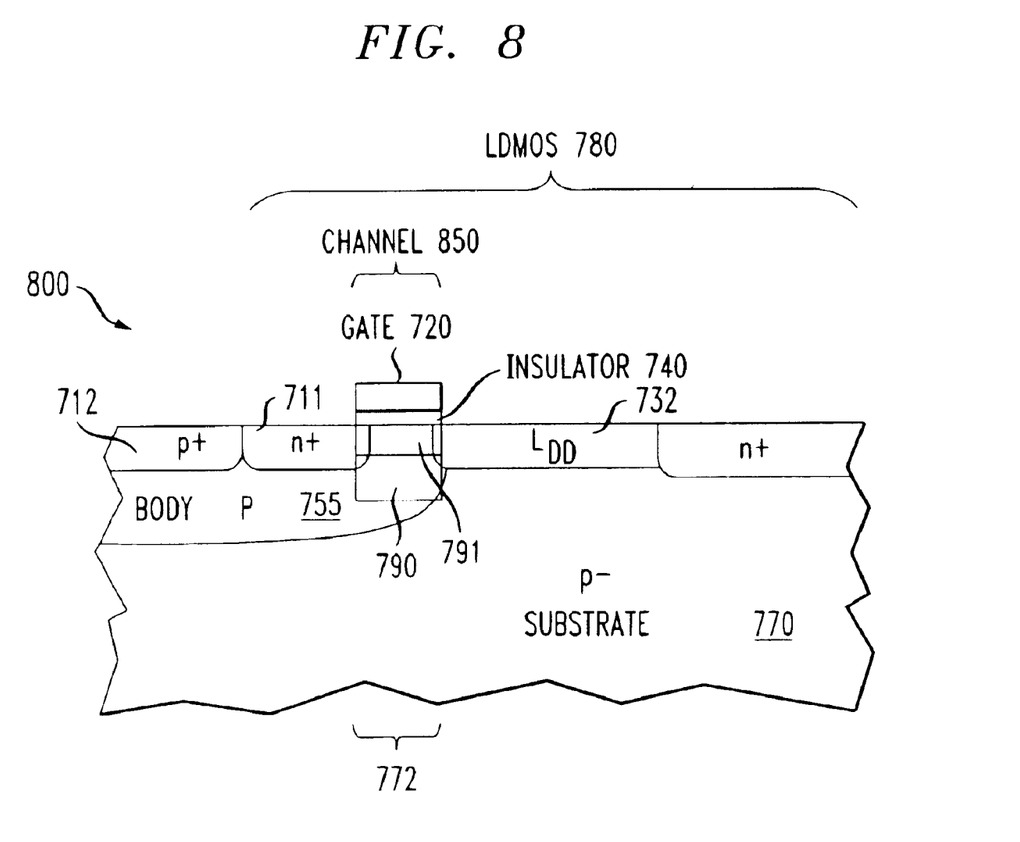

Turning now to FIG. 8, a semiconductor portion 800 is shown having an LDMOS device 780 with a strained silicon region 791. In this example, the strained silicon portion 791 and lattice mismatch material 790 are formed in the channel region 850. The strained silicon region 791 may be formed by the following technique. A hard mask (not shown) can be formed over substrate 770 and patterned so that the area 772 is uncovered. The area 772 is etched using conventional techniques. A lattice mismatch material layer is formed, as is a strained silicon layer. The strained silicon layer and lattice mismatch material layer are removed from the semiconductor portion 700 except in area 772 by selective etching. Then, the hard mask is removed through conventional techniques. Alternatively, the lattice mismatch material, strained silicon layer and hard mask can be removed via CMP.

Applying one or more strained silicon portions to a DMOS device can, as compared to conventional DMOS devices, increase the transconductance, lower the on-resistance, lower the knee-voltage, and increase the saturation current. It is beneficial that a strained silicon portion be placed in the drift region of a DMOS device, as the increases in the mobility and saturation velocity due to strained silicon in the drift region generally provide these advantages. As described above, however, strained silicon may also be applied to other areas of a DMOS device, such as the channel and source and drain regions. Any carrier transmit path where carriers flow from source region to drain region in a DMOS device should benefit from strained silicon, although benefits of strained silicon might be highest when the strained silicon is placed in the drift region.

It is to be understood that the embodiments and variations shown and described herein are merely illustrative of the principles of this invention and that various modifications may be implemented by those skilled in the art without departing from the scope and spirit of the invention.

What is claimed is:

1. A diffused metal oxide semiconductor (MOS) device comprising:
   a source region of a first conductivity type formed in a semiconductor region;
   a drain region of the first conductivity type formed in the semiconductor region;
   a gate proximate the source region and spaced apart from the drain region;
   a body of a second conductivity type formed in the semiconductor region, wherein the body at least partially overlaps the source region and at least partially overlaps the gate, the body forming at least a portion of a carrier transit path between the source region and the drain region, and wherein the body is spaced apart from the drain region; and
   at least one strained silicon portion formed at least in part in the carrier transit path.

2. The diffused MOS device of claim 1, wherein the at least one strained silicon portion is formed contiguous with a lattice mismatch material.

3. The diffused MOS device of claim 2, wherein the lattice mismatch material comprises silicon germanium or silicon carbide.

4. The diffused MOS device of claim 1, wherein a channel region of the diffused MOS device forms at least a portion of the carrier transmit path and wherein one or more of the at least one strained silicon portions are formed in the channel region.

5. The diffused MOS device of claim 1, wherein a drift region of the diffused MOS device further forms at least a portion of the carrier transit path and wherein one or more of the at least one strained silicon portions rare formed in the drift region.

6. The diffused MOS device of claim 5, wherein the drift region comprises multiple layers.

7. The diffused MOS device of claim 1, wherein a region of the diffused MOS device comprises an accumulation layer and wherein one or more of the at least one strained silicon portions are formed in the region of the diffused MOS device comprising the accumulation layer.

8. The diffused MOS device of claim 1, wherein:
   the semiconductor region comprises a substrate of the second conductivity type;
   the drain region is formed in the substrate;
   the gate is formed between the source region and drain region and above the semiconductor region;
   the diffused MOS device further comprises an insulator formed between the gate and the semiconductor region; and
   the diffused MOS device further comprises one or more diffusion areas formed in the substrate, at least part of the one or more diffusion areas underlying the gate, wherein the one or more diffusion areas are contiguous between the gate and the drain region, wherein at least part of the one or more diffusion areas abuts the drain region, and wherein each of the one or more diffusion areas is of the first conductivity type.

9. The diffused MOS device of claim 8, wherein the at least one strained silicon portion is a layer of strained silicon formed in the semiconductor region, wherein the semiconductor region further comprises a lattice mismatch layer formed under the strained silicon layer, and wherein the one or more diffusion areas, drain region and source region are at least partially formed in the layer of strained silicon.

10. The diffused MOS device of claim 8, wherein the semiconductor region further comprises a lattice mismatch layer formed under the at least one strained silicon portion, and wherein the at least one strained silicon portion is a layer of strained silicon formed to encompass a channel region of the diffused MOS device.

11. The diffused MOS device of claim 8, wherein the semiconductor region further comprises a lattice mismatch layer formed under the at least one strained silicon portion, and wherein the at least one strained silicon portion is a layer of strained silicon formed to encompass the one or more diffusion areas.

12. The diffused MOS device of claim 1, wherein:
   the semiconductor region further comprises a substrate and an oxide layer formed on the substrate;
   the at least one strained silicon portion comprises a strained silicon layer formed on the oxide layer;
   the drain region is formed in the strained silicon layer;
   the source region is formed in the strained silicon layer;
   the gate is formed between the source region and drain region and above the semiconductor region;
   the diffused MOS device further comprises an insulator formed between the gate and the semiconductor region; and
   the diffused MOS device further comprises a lightly doped drain overlapping the gate and intermediate the gate and the drain region.

13. The diffused MOS device of claim 1, wherein:
   the semiconductor region comprises a substrate of the first conductivity type and a lattice mismatch material formed on the substrate of the first conductivity type;
   the drain region is a doped layer formed in or on the substrate;
   the at least one strained silicon portion is formed as a layer on the lattice mismatch material;
   the gate is formed adjacent the source region and above the semiconductor region; and
   the diffused MOS device further comprises an insulator formed between the gate and the semiconductor region.

14. The diffused MOS device of claim 1, wherein:
   the gate is formed in a trench in the semiconductor region;
   the diffused MOS device further comprises an insulator formed surrounding the gate on at least three sides and abutting three sides of the trench;
   the source region is formed on one side of the gate;
   the body is formed under the source region;
   the semiconductor region further comprises a substrate of the first conductivity type;
   the drain region comprises a layer formed in or on the substrate;
   a lattice mismatch material is formed under the insulator formed under the gate; and
   the at least one strained silicon portion is formed under the gate and around the insulator.

15. A method for forming a diffused metal oxide semiconductor device, comprising the steps of:
   forming a source region of a first conductivity type in a semiconductor region;
   forming a drain region of the first conductivity type in the semiconductor region;

forming a gate proximate the source region and spaced apart from the drain region;

forming a body of a second conductivity type in the semiconductor region, wherein the body is formed to at least partially overlap the source region and at least partially overlap the gate, and wherein the body forms at least a portion of a carrier transit path between the source region and the drain region, and where the body is formed to be spaced apart from the drain region; and forming at least one strained silicon portion at least in part in the carrier transit path.

16. The method of claim 15, wherein the step of forming at least one strained silicon portion in the semiconductor region further comprises the steps of:

patterning a hard mask on a surface of the semiconductor region;

forming a lattice mismatch material on the patterned hard mask;

forming a layer of strained silicon on the lattice mismatch material; and removing the hard mask.

17. The method of claim 16, further comprising the step of etching one or more trenches prior to forming the lattice mismatch material, and wherein the step of removing the hard mask further comprises the step of removing the hard mask in all but the one or more trenches.

18. An integrated circuit comprising:

one or more diffused metal oxide semiconductor (MOS) devices, at least one of the one or more diffused MOS devices comprising:

a source region of a first conductivity type formed in a semiconductor region;

a drain region of the first conductivity type formed in the semiconductor region;

a gate proximate the source region and spaced apart from the drain region;

a body of a second conductivity type and formed in the semiconductor region, wherein the body at least partially overlaps the source region and at least partially overlaps the gate, the body forming at least a portion of a carrier transit path between the source region and the drain region, and wherein the body is spaced apart from the drain region;

at least one strained silicon portion formed at least in part in the carrier transit path.

19. The integrated circuit of claim 18, further comprising one or more complementary devices.

20. The integrated circuit of claim 18, further comprising one or more bipolar junction transistor devices.

* * * * *

UNITED STATES PATENT AND TRADEMARK OFFICE
CERTIFICATE OF CORRECTION

PATENT NO. : 6,828,628 B2
DATED : December 7, 2004
INVENTOR(S) : Hergenrother et al.

It is certified that error appears in the above-identified patent and that said Letters Patent is hereby corrected as shown below:

Column 9,
Line 37, before "formed" and after "portions" replace "rare" with -- are --.

Column 12,
Line 19, after "region;" insert -- and --.
Line 23, before "devices" and after "complementary" insert -- MOS --.

Signed and Sealed this

Sixth Day of September, 2005

JON W. DUDAS
*Director of the United States Patent and Trademark Office*